United States Patent [19]
Aina

[11] Patent Number: 5,242,843
[45] Date of Patent: Sep. 7, 1993

[54] METHOD FOR MAKING A HETEROJUNCTION BIPOLAR TRANSISTOR WITH IMPROVED HIGH FREQUENCY RESPONSE

[75] Inventor: Olaleye A. Aina, Columbia, Md.

[73] Assignee: Allied Signal Inc., Morris Township, Morris County, N.J.

[21] Appl. No.: 967,324

[22] Filed: Oct. 28, 1992

[51] Int. Cl.$^5$ .......................................... H01L 21/265
[52] U.S. Cl. .......................................... 437/31; 437/89; 437/90; 437/133; 437/909; 148/DIG. 72
[58] Field of Search .................... 437/31, 89, 90, 133, 437/126, 909; 148/DIG. 72

[56] References Cited

U.S. PATENT DOCUMENTS

| | | | |
|---|---|---|---|
| 4,679,305 | 7/1987 | Morizuka | 148/DIG. 84 |
| 4,712,121 | 12/1987 | Yokoyama | 357/4 |
| 4,746,626 | 5/1988 | Eda et al. | 437/133 |
| 4,896,203 | 1/1990 | Kajikawa | 357/34 |
| 4,914,049 | 4/1990 | Huang et al. | 437/31 |
| 4,935,796 | 6/1990 | Zuffada et al. | 357/34 |
| 4,935,797 | 6/1990 | Jambotkar | 357/34 |
| 5,024,958 | 6/1991 | Awano | 437/31 |
| 5,049,522 | 9/1991 | Stanchina et al. | 437/90 |
| 5,198,375 | 3/1993 | Hayden et al. | 437/89 |

Primary Examiner—Brian E. Hearn
Assistant Examiner—Tuan Nguyen
Attorney, Agent, or Firm—Howard G. Massung

[57] ABSTRACT

A method for making a heterojunction bipolar transistor in which the collector (46) is epitaxially grown on the subcollector layer (36) through a hole (42) formed in a layer of insulating material (40) deposited on the subcollector layer (36). A base (48) is epitaxially grown on the collector (46). Because of unequal lateral and vertical growth rates, the peripheral region of the base extends over the layer of insulating material. The n and n+ layers (50, 52) of the second type of semiconducting material are sequentially grown on the base and an n+ layer (54) of the first type of semiconducting material is grown on the sequentially grown layers (50, 52). The n+ layer (54) and the sequentially grown layer (50, 52) are etched to form an emitter mesa over the collector (46) leaving exposed the peripheral portion of the base (48) extending over the layer of insulating material surrounding the hole (42). Metallic electrodes (62, 64 and 68) are then deposited which electrically contact the base (48), the emitter (54) and the subcollector (36).

17 Claims, 2 Drawing Sheets

METHOD FOR MAKING A HETEROJUNCTION BIPOLAR TRANSISTOR WITH IMPROVED HIGH FREQUENCY RESPONSE

TECHNICAL FIELD

The invention is related to the field of manufacturing semiconductor devices and in particular to the manufacture of heterojunction bipolar transistors.

BACKGROUND ART

The high frequency response of a representative state of the art heterojunction bipolar transistor, such as shown in FIG. 1 depends on the parasitic capacitances in a complex manner. The current gain cut-off frequency, $f_t$, and the maximum frequency of operation, $f_{max}$, are given by:

$$f_t = \frac{g_m}{2\pi \{C_\pi + [1 + (R_E + R_c)] C_\mu/g_m\}} \quad (1)$$

and $$f_{max} = (f_t/8\pi R_B C_\mu)^{\frac{1}{2}} \quad (2)$$

where $g_m$ is the transconductance, $R_B$ is the base resistance, $C_\pi$ is the base-emitter capacitance, $C_\mu$ is the base collector capacitance, $R_E$ is the emitter resistance and $R_C$ is the collector resistance. Equations (1) and (2) show that the high frequency response can be increased by either increasing the transconductance, $g_m$, by reducing the resistances $R_B$, $R_C$, and $R_E$ or by reducing the capacitances $C_\pi$ and $C_\mu$. Conventional manufacturing techniques using self-alignment technology are only effective in reducing the base resistance which increases the maximum frequency operation, $f_{max}$, relative to the cut-off frequency, $f_t$. Further, improvement of the cut-off frequency, $f_t$, can be achieved by decreasing the dimensions of the heterojunction bipolar device so as to reduce the base emitter capacitance $C_\pi$ and the base-collector capacitance, $C_\mu$. However, this reduction in the capacitances $C_\pi$ and $C_\mu$ is normally counteracted by increases in the collector and emitter resistances, $R_C$ and $R_E$, respectively, resulting from the decreased dimensions. As the dimensions of the heterojunction bipolar transistor is reduced, the base-emitter capacitance, $C_\pi$, decreases much faster than the base-collector capacitance, $C_\mu$, because of the difference in the base and the collector regions. This implies that a fully self-aligned heterojunction bipolar transistor manufacturing process that reduces the base-collector capacitance $C_\mu$, much more than the emitter resistance, $R_E$, and collector resistance, $R_C$, are increased, is needed to manufacture heterojunction bipolar transistors having high current gain cut-off frequencies, $f_t$.

The prior art heterojunction bipolar transistor 10 shown in FIG. 1 has a semi-insulating semiconductor substrate such as a semi-insulating indium phosphide (InP) substrate 12 on which is grown an n+ indium gallium arsenide (InGaAs) subcollector layer 14. An n+ indium phosphide layer 16 forming a first mesa region. An n indium phosphide layer 18 is grown on top of n' indium phosphide layer 16 to form the collector and a p+ indium gallium arsenide base layer 20 is grown on top of the n indium phosphide layer 18 forming an intermediate mesa region. A top mesa region is formed by an n indium phosphide layer 22 as N+ indium phosphide layer 24 and n+ indium gallium aresenide emitter layer 26. Electrical contact to the subcollector layer 14, base layer 20 and emitter layer 26 by metallic contacts 28, 30 and 32, respectively, are made through a silicon oxide (SiO$_2$) overlayer 34. As previously indicated, this heterojunction bipolar transistor structure has a relatively high extrinsic base-collector capacitance $C_\mu$.

The invention is a method for making a heterojunction bipolar transistor in which the extrinsic base-collector capacitance is reduced by up to three orders of magnitude.

SUMMARY OF THE INVENTION

The invention is a method for making a heterojunction bipolar transistor in which the extrinsic base-collector capacitance is significantly reduced increasing the high frequency response of the transistor. The method comprises the steps of depositing a patterned subcollector layer of a first type of semiconducting layer on a semi-insulating substrate, depositing a layer of insulating material over the patterned subcollector layer, and etching a hole through the layer of insulating material. The partially fabricated substrate is then placed in an organometallic vapor phase epitaxy system in which a collector of the second type of semiconductor material is epitaxially grown on the subcollector layer within the hole of the layer of insulating material and a base of the first type of semiconductor material is epitaxially grown on the conductor. Due to the preferential lateral epitaxial growth of the base layer, a peripheral portion of the base extends over the layer of insulating material surrounding the hole. Successive n and n+ layers of the second type of semiconducting material are epitaxially grown on the base followed by a final n+ layer of the first type of semiconductor material epitaxially grown on the successive layers of the second type of semiconducting layers to form an emitter. The successive n+ and n layers of the first type of semiconductor material are etched to form an emitter mesa aligned with the hole in the layer of insulating material. The etching of the emitter mesa exposes the peripheral portions of the base extending over the layer of insulating material. The side walls of the emitter mesa are coated with an insulating material and metallic base electrodes are deposited on the exposed peripheral portions of the base using the emitter mesa as a mask. Metallic electrodes are deposited on the top surface of the emitter mesa and on the subcollector layer through apertures formed in the layer of insulating material using methods well known in the art.

The advantage of the disclosed process is that the extrinsic base-collector capacitance of the heterojunction bipolar transistor is significantly reduced.

Another advantage of the process is that the base electrodes are separated from the collector region by a layer of insulating material.

Another advantage is that the process is adaptable to double heterojunction bipolar transistor as well as heterojunction bipolar transistors.

Another advantage of the process is that it is adaptable to both npn and pnp heterojunction bipolar transistors.

These and other advantages will become more apparent from a reading of the specification in conjunction with the appended figures.

DETAILED DESCRIPTION OF THE PREFERRED EMBODIMENT

Figure 1:
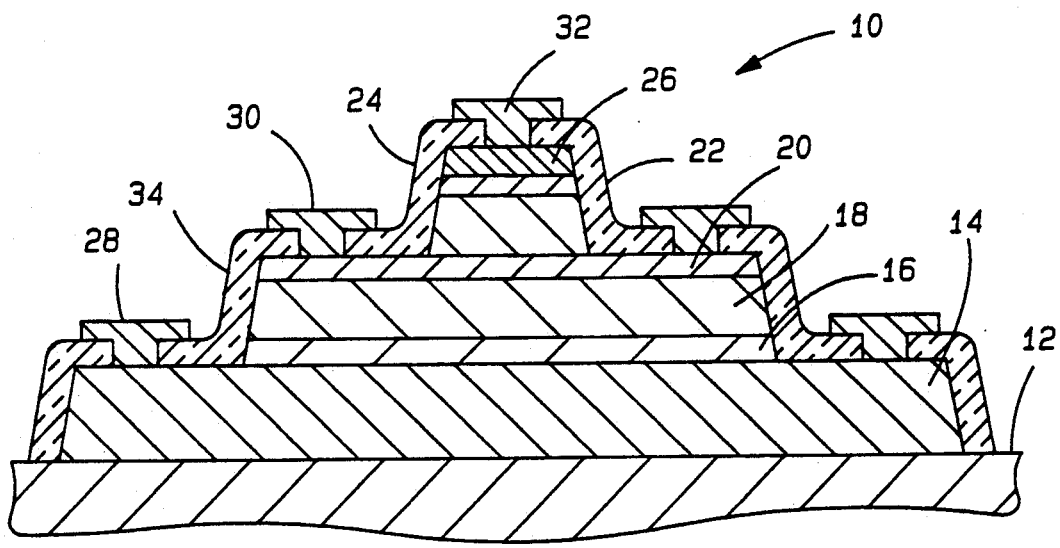
FIG. 1 is a cross-sectional view of a prior art heterojunction bipolar transistor.
Figure 2:
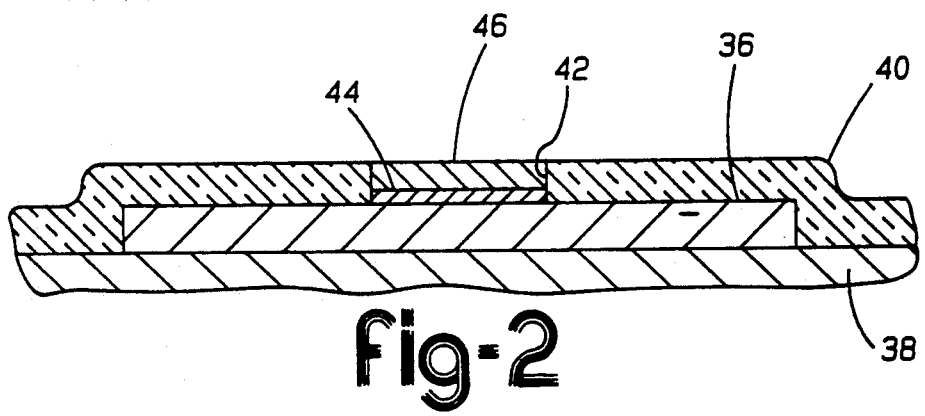
FIG. 2 is a cross-sectional view showing the structure resulting from the initial steps of the disclosed process.

The process of making a heterojunction bipolar transistor is shown in FIGS. 2 through 5. The process begins by depositing a subcollector layer 36 of a first type of semiconducting material on a semi-insulating layer 38 of a second type of semiconducting material. The subcollector layer 36 is patterned using normal photolithography processes. The patterned subcollector layer 36 is then overlayed with a thick (5,000 Å) layer 40 of an insulating material such as silicon dioxide (SiO$_2$). The layer 40 of insulating material is etched using an inverse emitter mesa mask to form a hole 42 in the layer 40 of insulating material where the emitter mesa will be.

Figure 3:
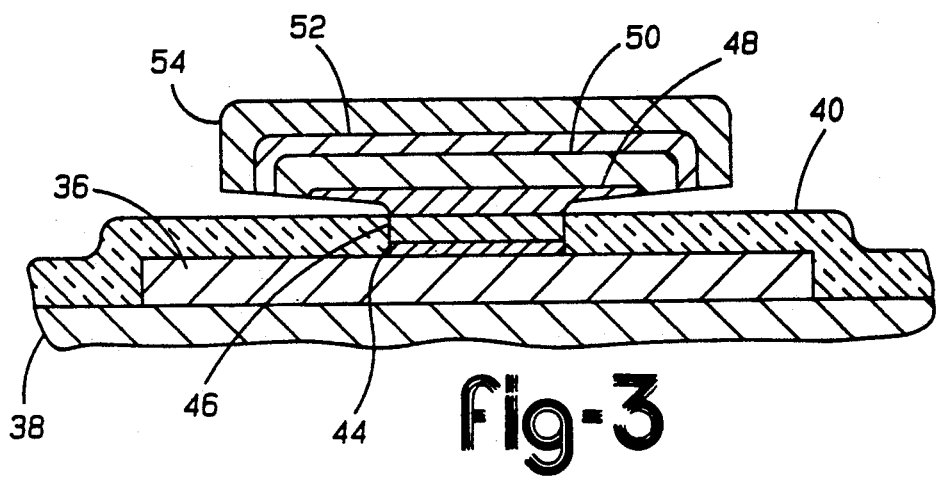
FIG. 3 is a cross-sectional view showing the structure resulting from the epitaxy growth of successive layers of semiconducting material.

The structure is then placed in an organometallic vapor phase epitaxy system and a n$^+$ layer 44 of the second type of semiconducting material is grown on the surface of the subcollector layer 36 within the hole 42 and an n-type layer 46 of the second type of semiconducting material is grown on the top surface of layer 44 to form a collector. Layers 44 and 46 substantially fill the hole 42 as shown. In the preferred embodiment, the n$^+$ layer 44 is approximately 1,000 Å thick and the n layer 46 is approximately 4,000 Å thick. A p$^+$ type layer of the first type of semiconductor material is then epitaxially grown on the n-type layer 46 to form a base 48 as shown in FIG. 3. As is well known in the art, the lateral growth rate of a semiconductor layer using organometallic vapor phase epitaxy methods is approximately 5 times greater than the vertical growth rate. As a result, the peripheral region of base 48 is cantilevered over the layer of insulating material 40 as shown. After the epitaxy growth of the base 48, a n-type layer 50 of the second type of semiconducting material is grown on said base 48 followed by an n$^+$ layer 52 of the second type of semiconducting material is grown on top of the layer 50. Finally, an n$^+$ type layer of the first type of semiconducting material is grown on the layer 52 to form emitter 54.

As a result of the organometallic vapor phase epitaxy growth of layers 50 and 52 and base 54, the lateral growth rate is much greater than the vertical growth rate. Therefore, the successive layers 50, 52 and 54 grown on the base 48 form a mushroom shaped mesa, the periphery of which overhangs the layer of insulating material 40 as shown on FIG. 3.

Figure 4:
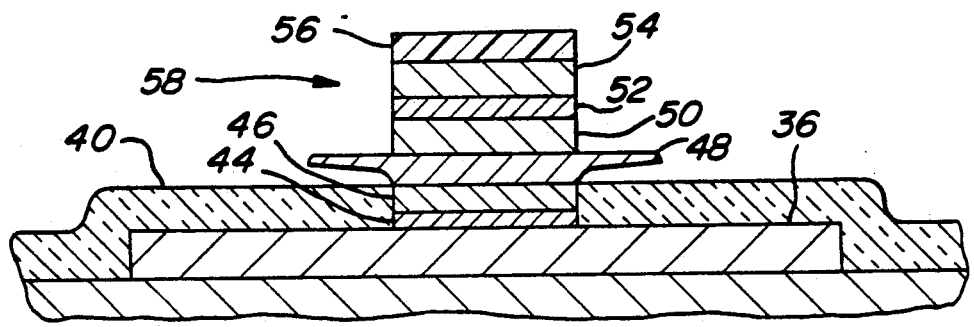
FIG. 4 is a cross-sectional view of the structure after etching the emitter mesa.
Figure 5:
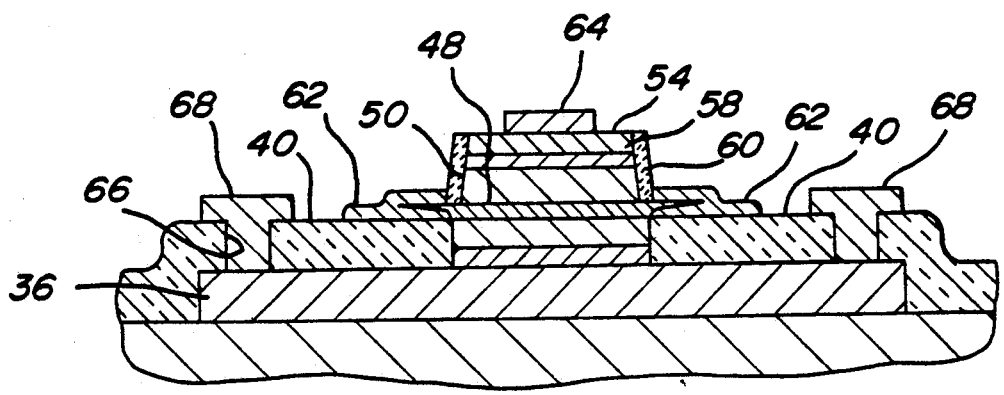
FIG. 5 is a cross-sectional view of a completed heterojunction bipolar transistor.

An emitter mask 56 is formed on the top surface of the emitter 54 aligned with the hole 42 as shown in FIG. 4. Using normal photolithography processes, the semiconductor layers 50, 52 and 54 are etched forming an emitter mesa 58 using either a wet etch or an ion bombardment etch. After the emitter mesa 58 is formed, the side walls of the emitter mesa 58 are coated with an insulating material, such as a layer of silicon dioxide 60 as shown in FIG. 5. The base layer 48 is metalized using an appropriate mask to form a base electrode 62 which is self-aligned with the emitter mesa 58. The fabrication of the heterojunction bipolar transistor is then completed by metalizing the top of the emitter mesa 58 to form an emitter electrode 64 and etching holes 66 through the silicon dioxide layer 40 to the subcollector layer 36 as shown. Collector electrodes 68 are then deposited through the holes 66 to make electrical contact with the subcollector layer 36. As a result of this fabrication method, the extrinsic base and collector regions are separated by a layer of insulating material which reduces the extrinsic base/collector capacitance $C\mu$ by at least three orders of magnitude.

In a preferred embodiment, the semi-insulating layer is an iron doped indium phosphide substrate and the subcollector layer 36 is a n$^+$ indium gallium arsenide (n$^+$InGaAs) layer. The n$^+$ semiconducting layer 44 is an n$^+$ indium phosphide (n$^+$InP) layer approximately 1,000 Å thick and said collector layer 46 is an n indium phosphide (nInP) layer approximately 4,000 Å thick. The base 48 is a p$^+$ indium gallium arsenide (p$^+$InGaAs) layer approximately 1,500 Å thick, the semiconductor layer 50 is an n indium phosphide (nInP) layer approximately 4,000 Å thick, the semiconductor layer 50 is an n$^+$ indium phosphide (n$^+$InP) layer approximately 500 Å thick, and the emitter 54 is a n$^+$ indium gallium arsenide (n$^+$InGaAs) layer approximately 3,000 Å thick.

This fabrication process is not limited to the indium phosphide/indium gallium arsenide heterojunction bipolar transistors, but is applicable to heterojunction bipolar transistors using alternate semiconductor material combinations, including but not limited to, indium phosphide/indium gallium arsenic phosphide (InP/InGaAsP), aluminum indium arsenide/indium gallium arsenide (AlInAs/InGaAs), aluminum gallium arsenide/gallium arsenide (AlGaAs/GaAs) and germanium silicon/germanium (GeSi/Ge). The fabrication process is applicable to both npn and pnp heterojunction bipolar transistors.

Having disclosed a preferred process for fabricating a heterojunction bipolar transistor, it is recognized that those skilled in the art may modify the process or use other semiconducting material combinations within the scope of the invention as set forth in the appended claims.

What is claimed is:

1. A process for making a heterojunction bipolar transistor comprising the steps of:

depositing a patterned subcollector layer of a first type of semiconductor material on a semi-insulating substrate of a second type of semiconductor material;

depositing an insulating layer over said patterned subcollector layer and said semi-insulating substrate in the region surrounding said patterned subcollector layer;

forming a hole through said insulating layer to said subcollector layer defining a collector region;

epitaxially growing a first layer of said second type of semiconductor material on said subcollector layer in said hole to form a collector;

epitaxially growing a first layer of said first type of semiconductor material on said collector to form a base, the periphery of said base being cantilevered over said insulating layer;

epitaxially growing at least a second layer of said second semiconducting material on said base;

epitaxially growing a second layer of said first type of semiconducting material on said at least a second layer to form an emitter;

etching said emitter and said at least a second layer to form an emitter mesa concentric with said hole formed in said insulating layer, said emitter mesa having a shape and a size substantially equal to the shape and size of said hole; and providing metallic electrodes electrically contacting said emitter, said base and said patterned subcollector layer.

2. The process of claim 1 wherein said step of depositing a patterned layer comprises the steps of:

depositing said first type of semiconductor material on said substrate to form a layer of said first type of semiconductor material; and patterning said layer of said first type of semiconductor material using a photolithography process to form said patterned semiconductor layer.

3. The process of claim 1 wherein said step of epitaxially growing said first layer of said second type of semiconducting material comprises the steps of:

epitaxially growing a first n+ type layer of said second type of semiconducting material on said patterned subcollector on said patterned subcollector layer in said hole; and epitaxially growing a first n-type layer of said second type of semiconductor material on said first n+ type layer to form said collector.

4. The process of claim 3 wherein said step of epitaxially growing at least a second layer of said second type of semiconductor material comprises the steps of:

epitaxially growing a second n-type layer of said second type semiconducting material on said base; and epitaxially growing a second n+ layer of said second type of semiconductor material on said second n-type layer.

5. The process of claim 4 wherein said step of etching comprises:

forming a mask on said emitter concentric with said hole using photolithography techniques;

ion bombarding to ion etch said emitter, said second n+ semiconductor layer of said second type and said n semiconducting layer of said second type in the region circumscribing said mask to form said emitter mesa.

6. The process of claim 1 wherein said emitter mesa has a vertical surface circumscribing said emitter mesa, said process further includes the step of depositing and insulating layer covering said vertical surface.

7. The process of claim 1 wherein said step of providing metallic electrodes comprises the step of depositing said metallic electrodes on said base using said emitter mesa as a self-aligned mask.

8. The process of claim 1 wherein said step of providing metallic electrodes comprises the steps of forming holes through said insulating layer to said subcollector layer and depositing said metallic electrodes through said holes.

9. The process of claim 1 wherein said steps of epitaxially growing said first and second layers of said first type of semiconducting surfaces comprises the step of epitaxially growing said first and second layers of said first type of semiconductor material using organometallic vapor phase epitaxy.

10. The process of claim 1 wherein said steps of epitaxially growing said first and second layers of said second type of semiconducting material comprises the steps of epitaxially growing said first and second layers of said type of semiconductor material using organometallic vapor phase epitaxy.

11. The process of claim 1 wherein said first type of semiconducting material is indium phosphide and said second type of semiconductor material is indium gallium arsenide.

12. A process of making a heterojunction bipolar transistor comprising the steps of:

forming a patterned subcollector layer of a first type of semiconducting material on a semi-insulating substrate of a second type of semiconducting material;

depositing a layer of insulating material on said subcollector layer;

etching a first hole through said insulating material to expose a portion of said subcollector layer therethrough;

placing said substrate with said subcollector layer and said insulating layer in an organometallic vapor phase epitaxy system;

epitaxially growing in said organometallic vapor phase epitaxy system a first n+ layer of said second type of semiconductor material on said subcollector layer within said hole;

epitaxially growing a first n-type layer of said second type of semiconductor material on said first n+ layer of said second type of semiconducting material within said hole to form a collector;

epitaxially growing a p+ type layer of said first type of semiconducting material on said collector to form a base, the peripheral region of said base extending over a portion of said layer insulating material circumscribing said hole;

epitaxially growing a second n-type layer of said second type of semiconductor material on said base;

epitaxially growing a second n+ type layer of said second type of semiconducting layer on said second n-type layer of said second type of semiconducting material;

epitaxially growing a second n+ layer of said first type of semiconducting material on said second n-type layer of said second type of semiconducting material to form an emitter;

forming a mask on the surface of said emitter vertically aligned with said hole, said mask having a shape and size substantially identical to the shape and size of said hole;

etching said n+ layer of said first type of semiconducting material and said second n+ and n-type layers of said second type of semiconducting material to form an emitter mesa centrally disposed on said base, said etching exposing a lateral portion of said base circumscribing said emitter mesa;

depositing a second layer of insulating covering the side walls of said emitter mesa;

depositing a base metallic electrode on said exposed lateral portion of said base using said emitter mesa as a self-aligned mask;

depositing an emitter metallic electrode on said emitter;

etching at least a second hole through said first insulating material offset from said first hole to expose a portion of said subcollector layer; and depositing a collector metallic electrode on said subcollector layer through said second hole.

13. The process of claim 12 wherein said first type of semiconducting material is indium gallium arsenide (InGaAs) and said second type of semiconducting material is indium phosphide (InP).

14. The process of claim 12 wherein said first type of semiconducting material is indium gallium arsenic phosphide (InGaAsP) and said second type of semiconducting material is indium phosphide (InP).

15. The process of claim 12 wherein said first type of semiconducting material is indium gallium arsenide (InGaAs) and said second type of semiconducting material is aluminum indium arsenide (AlInAs).

16. The process of claim 12 wherein said first type of semiconducting material is gallium arsenide (GaAs) and said second type of semiconducting material is aluminum gallium arsenide (AlGaAs).

17. The process of claim 12 wherein said first type of semiconducting material is germanium (Ge) and said second type of semiconducting material is germanium silicon (GeSi).

* * * * *